United States Patent [19]
Olieslagers et al.
[11] 4,448,866
[45] May 15, 1984

[54] METHOD OF ELECTROPHOTOGRAPHICALLY MANUFACTURING A DISPLAY SCREEN FOR A COLOR DISPLAY TUBE

[75] Inventors: Henri G. Olieslagers; Frederik B. Melgert, both of Eindhoven, Netherlands

[73] Assignee: U.S. Philips Corporation, New York, N.Y.

[21] Appl. No.: 369,949

[22] Filed: Apr. 19, 1982

[30] Foreign Application Priority Data

May 7, 1981 [NL] Netherlands ........................ 8102224

[51] Int. Cl.3 ........................... G03F 5/00; G03F 7/00

[52] U.S. Cl. ........................................ 430/24; 430/31; 430/97

[58] Field of Search ....................... 430/24, 28, 29, 31, 430/97

[56] References Cited

U.S. PATENT DOCUMENTS

| | | | |
|---|---|---|---|
| 3,146,100 | 8/1964 | Kaufman | 430/31 X |
| 3,355,288 | 11/1967 | Matkan | 430/31 X |
| 3,475,169 | 10/1969 | Lange | 430/97 X |
| 3,514,287 | 5/1970 | Donohue et al. | 430/24 |
| 3,615,462 | 10/1971 | Szegho et al. | 430/25 X |
| 4,045,224 | 8/1977 | Yamazaki et al. | 430/24 |
| 4,324,850 | 4/1982 | Tomita et al. | 430/24 |

*Primary Examiner*—Roland E. Martin, Jr.
*Attorney, Agent, or Firm*—Robert J. Kraus

[57] ABSTRACT

In an electrophotographic process for producing a display screen on the window of a color display tube, a step is performed which increases the potential difference between areas of the screen which have been charged to attract charged particles of a screening material and areas of the screen not charged to attract such particles. This increased potential difference increases the attraction force, thereby improving particle retention until the screening material is permanently attached.

1 Claim, 6 Drawing Figures

METHOD OF ELECTROPHOTOGRAPHICALLY MANUFACTURING A DISPLAY SCREEN FOR A COLOR DISPLAY TUBE

BACKGROUND OF THE INVENTION

The invention relates to a method of electrophotographically manufacturing a display screen for a colour television display tube, comprising the steps of providing a firable, electrically conductive layer on the inside of the display window of the tube, providing on the layer a firable photoconductive layer, electrically charging the photoconductive layer, forming a latent charge image on the photoconductive layer developing the image into a pattern of charged particles from an apolar liquid, the charge on the particles being opposite to the charge with which the photo-conductive layer is charged and drying the pattern of particles.

Such a method is disclosed in U.S. Pat. No. 3,475,169, which also describes a few modified embodiments of the above electrophotographic method. For the formation of the charge image two exposure methods are possible. In accordance with the first method, a positive light image of the apertures in a colour selection electrode is formed. In accordance with the second method a negative light image is formed, which means that each aperture in the colour selection electrode is displayed by a shadow on the photoconductive layer. A suitable exposure method for the formation of a negative light image is the dark source method, in which use is made of two or more light sources at some distance from each other, as described in published German patent application No. 2,248,878 corresponding to British Patent Specification No. 1,396,918 published June 11, 1975.

The dispersions of charged phosphor particles and of charged, light-absorbing, particles in an electrically insulating liquid are, for example, those which are described in German patent application No. 19 28 817 laid open to public inspection, corresponding to British Patent Specification No. 1,318,396 published May 31, 1973. These dispersions consist of an apolar dispersion agent in which one or more surface-active, ion-forming substances are dissolved with such a dissociation capacity that their electric conductivity is larger than $10^{-12}$ $Ohm^{-1}$ $cm^{-1}$ (larger than 100 p S/m, preferably between $1\times10^{-10}$ and $1\times10^{-11}$ $Ohm^{-1}$ $cm^{-1}$ (between 10,000 and 1,000 p S/m) in which the phosphor particles in question are dispersed, At the phosphor particles-dispersion agent interface, the ion-forming substances build up a zeta potential. In practice the Siemens/meter has found acceptance in the last few years as a unit of electrical conductivity. The Siemens is equal to 1 $Ohm^{-1}$, so that 1 p S/m is equal to $10^{-14}$ $Ohm^{-1}$ $cm^{-1}$.

In the method described, the photoconductive layer is, for example, charged to $-300$ V by means of a negative corona discharge. Those areas of the layer where no particles are to be provided are then exposed to light. For example, if a pattern of light-absorbing particles is to be provided before the phosphor patterns, those areas are exposed to light where the phosphor is to be later provided. This exposure is sufficient to form a latent charge image having the desired dimensions of the pattern. The charge image thus formed is developed with a suspension containing light-absorbing particles having a positive charge, which are deposited on the negatively charged areas between the exposed areas. The pattern of light-absorbing particles thus formed is then dried with compressed air. It has been found that the adhesion of particles provided in this manner is inadequate and damage to the pattern may occur.

SUMMARY OF THE INVENTION

It is an object of the invention to provide a method in which the adhesion of the particles is better, so that such damage is prevented.

According to the invention, a method of electrophotographically manufacturing a display screen for a colour display tube, as described, is characterized in that prior to or during the beginning of the drying process the photoconductive layer is uniformly exposed between the pattern of particles provided thereon. Because the exposure needed to obtain the charge image must be done with a given dose to obtain the desired dimensions of the regions of the pattern, a quantity of charge remains in the places where exposure is carried out. For exaple, when the photoconductive layer is charged to $-300$ V the potential in the exposed regions might be $-150$ V. By uniformly exposing the photoconductive layer, after providing the electrically charged particles (light-absorbing particles or phosphor particles) but prior to or during the beginning of the drying process, between the pattern of particles provided thereon, the charge between the already provided pattern of particles flows away completely, thus reducing the potential to approximately 0 V. In this manner a larger potential difference is produced between the photoconductive layer below the pattern of particles and the remainder of the photoconductive layer, as a result of which the particles are better retained and a better adhesion is obtained.

BRIEF DESCRIPTION OF THE DRAWING

The invention will now be described in greater detail by means of two examples and a drawing, the Figures of which illustrate the method of example 1.

DESCRIPTION OF THE PREFERRED EMBODIMENTS

Example 1

Figure 1A:
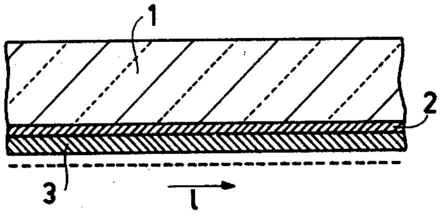
FIG. 1*a* shows a part of a display window with an electrically conductive layer and a photoconductive layer.
Figure 1B:
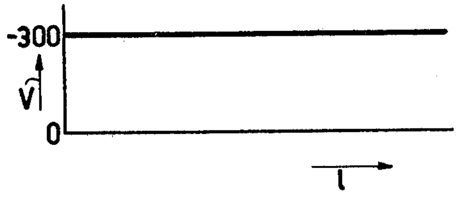
FIG. 1*b* shows the surface potential as a function of the place on the negatively charged photoconductive layer.
Figure 2A:
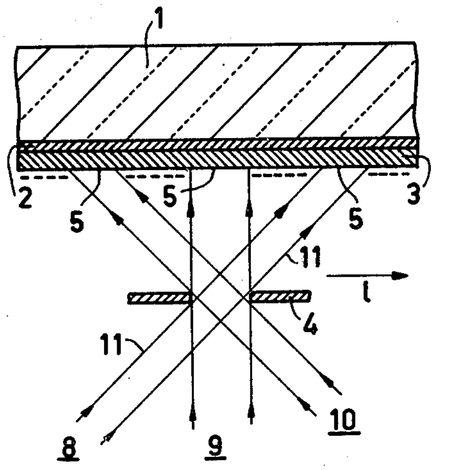
FIG. 2*a* shows exposure of the photoconductive layer prior to providing a charge pattern.
Figure 2B:
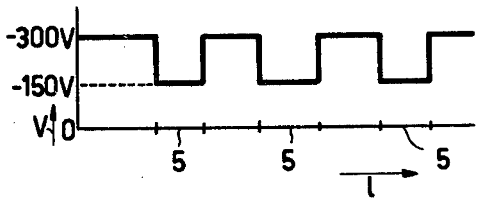
FIG. 2*b* shows the surface potential analogous to FIG. 1*b* after the exposure.
Figure 3A:
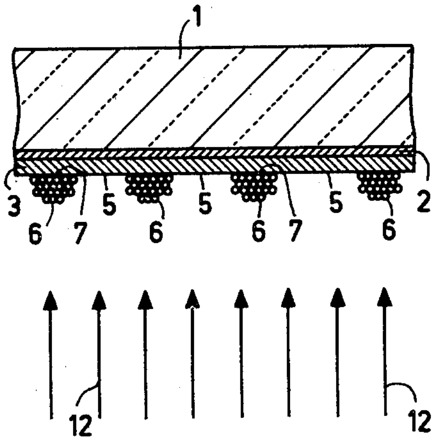
FIG. 3*a* shows the uniform exposure via a pattern of particles.
Figure 3B:
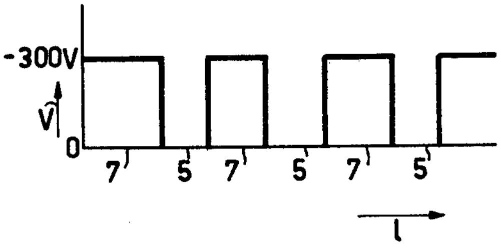
FIG. 3*b* shows the effect on the variation of the surface potential.

As shown in FIG. 1*a*, an electrically conductive layer 2 comprising a quarternary ammonium salt is provided on the inside of a display window 1 of a colour television display tube. This layer has a thickness of, for example, 1 μm and a sheet resistance smaller than $10^8\omega$ ($10^8\omega\square$). A 3 μm thick photoconductive layer 3 of polyvinylcarbazol having a sheet resistance of $10^{16}\omega$ ($10^{16}\omega\square$) is provided thereon. The layer 3 is then charged negatively (— signs in the Figure) by means of a negative corona discharge to a surface potential of $-300$ Volts. This is shown in FIG. 1*b*, in which the potential is shown as a ffunction of the place on the photoconductive layer. As shown in FIG. 2*a*, exposure of locations 5 where phosphor is to be provided is then carried out via a colour selection electrode 4, of which only one aperture is shown, by light rays 11 from three different positions 8, 9 and 10. The direction of each light ray is denoted by arrows. Tue exposure is sufficient to form a latent charge image having the desired dimensions. So much charge flows away that the potential in locations 5 drops to approximately −150 Volts as shown in FIG. 2*b*, in which the potential is again shown as a function of the location on the photoconductive layer. This charge image is then developed by means of positively charged soot particles 6 suspended in an apolar liquid to form a pattern. As shown in FIG. 3*a*, the photoconductive layer is then uniformly exposed between the pattern of light-absorbing particles 6 present thereon (arrows 12), so that the charge on the intermediate regions 5 between the pattern of particles can flow away substantially entirely. As a result of this, a larger potential difference is established between the regions 7 covered with light-absorbing particles and the intermediate regions 5, as is shown in FIG. 3*b*, so that during the subsequent drying process the particles are better held. After drying, the display window is covered with a pattern of light-absorbing particles between which the phosphor regions may then be provided.

Example 2

An electrically conductive layer comprising a quarternary ammonium salt and a photoconductive layer of polyvinylcarbazol analogous to example 1 is provided on the inside of a display window of a colour television display tube. The photoconductive layer is then charged negatively by means of a negative corona discharge. A negative light image of the apertures in a colour selection electrode is then formed on the photosensitive layer. The exposure is sufficient to establish a latent charge image of the desired dimensions. The charge image is then developed with a suspension containing positively charged phosphor particles to form a the pattern of particles. The photoconductive layer is then uniformly exposed between the pattern of particles and the charge flows away in the places where no phosphor particles have been deposited. As a result of this a larger potential difference is established between the regions of the photoconductive layer covered with phosphor particles and the uncovered regions of the photoconductive layer, so that the pattern of phosphor particles is better held during the subsequent drying process. Drying of the pattern may be done by means of an air flow in which a part of the liquid is evaporated and another part is blown away. The dried screen is then charged again, after which the method may be repeated for providing phosphor particles of a different colour.

It will be obvious that the method may be used both for providing light-absorbing particles and for providing phosphor particles. It is also possible to charge the photoconductive layer positively and to charge the particles negatively.

What is claimed is:

1. In a method of manufacturing a display screen on a color display tube window including the steps of:

(a) providing an electrically conductive layer on the window;

(b) providing a photoconductive layer on the electrically conductive layer;

(c) establishing a substantially uniform electric charge on the photoconductive layer;

(d) exosing selected areas of the photoconductive layer with light to effect conductive of the charge away from said areas, thereby forming a latent charge image;

(e) applying to the photoconductive layer a solution containing particles charged to the opposite polarity of the charge forming the latent image, thereby effecting deposition of said charged particles on the photoconductive layer in a pattern corresponding to said charge image; and (f) blow drying the pattern of particles;

the improvement comprising increasing particle adhesion by uniformly exposing with light the portions of the photoconductive layer lying between the deposited pattern of particles to effect conduction of any remaining charge away from said portions, said uniform exposure being made before the drying step is completed.

* * * * *

UNITED STATES PATENT AND TRADEMARK OFFICE
CERTIFICATE OF CORRECTION

PATENT NO. : 4,448,866

DATED : May 15, 1984

INVENTOR(S) : HENRI G. OLIESLAGERS; FREDERIK B. MELGERT

It is certified that error appears in the above—identified patent and that said Letters Patent is hereby corrected as shown below:

CLAIM 1, COLUMN 4, LINE 27, CHANGE "conductive" to --conduction--

Signed and Sealed this

*Eighteenth* Day of *June 1985*

[SEAL]

*Attest:*

DONALD J. QUIGG

*Attesting Officer* *Acting Commissioner of Patents and Trademarks*